US009346686B2

(12) United States Patent
Ding et al.

(10) Patent No.: US 9,346,686 B2
(45) Date of Patent: May 24, 2016

(54) COPPER-CONTAINING NANOCRYSTALS AND METHODS OF PREPARATION THEREFOR

(71) Applicant: The University of Western Ontario, London (CA)

(72) Inventors: Zhifeng Ding, London (CA); Falong Jia, Wuhan (CN); Dave Love, Orillia (CA); Myong In Oh, London (CA); Daniel Vaccarello, Mississauga (CA); Amy Tapley, Amherstburg (CA)

(73) Assignee: The University of Western Ontario, London, ON (CA)

( * ) Notice: Subject to any disclaimer, the term of this patent is extended or adjusted under 35 U.S.C. 154(b) by 25 days.

(21) Appl. No.: 14/367,775

(22) PCT Filed: Dec. 24, 2012

(86) PCT No.: PCT/CA2012/050940
§ 371 (c)(1),
(2) Date: Jun. 20, 2014

(87) PCT Pub. No.: WO2013/091114
PCT Pub. Date: Jun. 27, 2013

(65) Prior Publication Data
US 2015/0360967 A1 Dec. 17, 2015

Related U.S. Application Data

(60) Provisional application No. 61/579,251, filed on Dec. 22, 2011, provisional application No. 61/704,969, filed on Sep. 24, 2012.

(51) Int. Cl.
| *G01G 15/00* | (2006.01) |
| *C01G 19/00* | (2006.01) |
| *C01B 17/00* | (2006.01) |
| *H01L 31/00* | (2006.01) |
| *C01G 15/00* | (2006.01) |
| *C01B 19/00* | (2006.01) |
| *H01L 31/032* | (2006.01) |
| *H01L 31/0352* | (2006.01) |
| *B82Y 30/00* | (2011.01) |

(52) U.S. Cl.
CPC .............. *C01G 15/006* (2013.01); *B82Y 30/00* (2013.01); *C01B 19/002* (2013.01); *C01G 19/006* (2013.01); *H01L 31/0322* (2013.01); *H01L 31/035218* (2013.01); *C01P 2002/52* (2013.01); *C01P 2002/72* (2013.01); *C01P 2004/03* (2013.01); *C01P 2004/04* (2013.01); *C01P 2004/64* (2013.01); *C01P 2006/40* (2013.01); *Y02E 10/541* (2013.01)

(58) Field of Classification Search
CPC ...... C01G 15/00; C01G 19/00; H01L 31/032; H01L 31/0352; H01L 31/0322; C01B 17/00
See application file for complete search history.

(56) References Cited

U.S. PATENT DOCUMENTS

| 7,476,599 B2 * | 1/2009 | Wang ..................... B82Y 10/00 257/E21.09 |
| 2012/0055554 A1 * | 3/2012 | Radu ..................... B82Y 30/00 136/264 |
| 2012/0231276 A1 | 9/2012 | Chane-Ching et al. |

FOREIGN PATENT DOCUMENTS

| WO | 2008/021604 A2 | 2/2008 |
| WO | 2010/135622 A1 | 11/2010 |
| WO | 2011/065994 A2 | 6/2011 |

OTHER PUBLICATIONS

International Search Report received for PCT Patent Application No. PCT/CA2012/050940, mailed on May 7, 2013, 8 pages.
Written Opinion received for PCT Patent Application No. PCT/CA2012/050940, mailed on May 7, 2013, 9 pages.
Todorov et al., "High-Efficiency Solar Cell with Earth-Abundant Liquid-Processed Absorber", vol. 22, 2010, pp. E156-E159.
Botti et al., "Band Structures of Cu2ZnSnS4 and Cu2ZnSnSe4 from many-body Methods", Applied Physics Letters, vol. 98, 2011, pp. 241915-1-241915-3.
Yue et al., "Cuins2 Quantum Dots Synthesized by a Solvothermal Route and their Application as Effective Electron Acceptors for Hybrid Solar Cells", Journal of Materials Chemistry, vol. 20, No. 35, 2010, pp. 7570-7578.
Pawar et al., "Single Step Electrosynthesis of Cu2ZnSnS4 (CZTS) thin Films for Solar Cell Application", Electrochimica Acta, vol. 55, 2010, pp. 4057-4061.
Goossens et al., "Spray-Deposited $CuInS_2$ Solar Cells", Nanotechnology, vol. 19, 2008, pp. 1-8.
Kumar et al., "Preparation and Characterization of Spray-Deposited $Cu_2ZnSnS_4$ Thin Films", Solar Energy Materials and Solar Cells, vol. 93, 2009, pp. 1230-1237.

(Continued)

*Primary Examiner* — Timothy Vanoy
(74) *Attorney, Agent, or Firm* — Fiala & Weaver P.L.L.C.

(57) ABSTRACT

A one-pot approach for preparing ArSH capped $Cu_2ZnSnS_4$, $Cu_2ZnSn(S_{(1-x)}Se_x)_4$, $Cu_2SnS_3$, $CuInS_2$, and $CuIn(S_{(1-x)}Se_x)_2$ nanocrystals is provided. Examples involving reacting copper (II) acetylacetonate and indium chloride with thiourea and 2-mercapto-5-n-propylpyrimidine in the presence of an organic solvent are described. Monodispersed $CuInS_2$, nanocrystals having a size of about 100 nm were prepared. Examples involving reacting copper (II) acetylacetonate, zinc chloride, and tin chloride with thiourea and 2-mercapto-5-n-propylpyrimidine in the presence of an organic solvent are described. Monodispersed $Cu_2ZnSnS_4$ nanocrystals having a size of about 2 nm were prepared. Nanociystals obtained were found to have excellent crystallinity, stoichiometry, and high collective photovoltaic activity without the need for postprocessing such as high temperature annihilation in a sulfur atmosphere.

26 Claims, 3 Drawing Sheets

(56) References Cited

OTHER PUBLICATIONS

Nakamura et al., "Preparation of CuInS$_2$ Films with Sufficient Sulfur Content and Excellent Morphology by one-step Electrodeposition", Solar Energy Materials and Solar Cells, vol. 49, 1997, pp. 415-421.

Li et al., "Solution-Processed Inorganic Solar Cell Based on in Situ Synthesis and Film Deposition of CuInS$_2$ Nanocrystals", Journal of the American Chemical Society, vol. 132, No. 1, 2009, pp. 22-23.

Han et al., "Synthesis of Copper Indium Sulfide Nanoparticles by Solvothermal Method", Materials Letters, vol. 63, 2009, pp. 1192-1194.

Panthani et al., "Synthesis of CuInS$_2$, CuInSe$_2$, and Cu(In$_x$Ga1-x)Se$_2$ (CIGS) Nanocrystal "Inks" for Printable Photovoltaics", Journal of the American Chemical Society, vol. 130, 2008, pp. 16770-16777.

Siebentritt, "Wide Gap Chalcopyrites: Material Properties and Solar Cells", Thin Solid Films 403-404, 2002, pp. 1-8.

* cited by examiner

COPPER-CONTAINING NANOCRYSTALS AND METHODS OF PREPARATION THEREFOR

This application is a national stage application of International Application No. PCT/CA2012/050940, filed Dec. 24, 2012, and claims benefits under 35 USC §119 of U.S. Provisional Application Ser. Nos. 61/579,251 and 61/704,969 filed Dec. 22, 2011 and Sep. 24, 2012, respectively, and the entire disclosures of the referenced applications are incorporated herein by reference.

The invention relates to copper- and sulfur-containing nanoparticles, such as $CuInS_2$ and $Cu_2ZnSnS_4$ nanocrystals, methods of their production, and uses thereof, particularly in photovoltaics.

BACKGROUND

Bulk $CuInS_2$ has a direct band gap of 1.53 eV, and Bulk $Cu_2ZnSnS_4$ has a direct band gap of 1.45-1.51 eV. These each correspond well with the solar spectral range needed for photovoltaic applications. The band gap of bulk $Cu_2ZnSnS_4$ is larger than the 1.05 eV of $CuInSe_2$ and similar to the 1.53 eV band gap of $CuInS_2$.

It has been reported that the theoretical efficiency of 28.5% of $CuInS_2$ solar cells is the highest among the Cu chalcopyrite solar cells (S. Siebentritt, Thin Solid Films, 403-404 (2002) 1). $CuInS_2$ solar cells are expected to show efficiencies superior to those of Cu(In,Ga)Se solar cells. It has been reported that the theoretical efficiency of ~30% of $Cu_2ZnSnS_4$ solar cells is one of the highest among the quaternary chalcogenides solar cells (S. Botti et al., Applied Physics Letters, 98, 241915-8 (2011)).

To date, the efficiency of solar cells based on sulfide has reached only about 60% of the selenides resulting in continuing efforts to improve the efficiency of $CuInS_2$ solar cells. Solar cells based on a $CuInS_2$ absorber layer prepared by vacuum deposition techniques have reached efficiencies of 11.4% (S. Siebentritt, Thin Solid Films, 403-404 (2002) 1). $Cu_2ZnSnS_4$ solar cells are expected to show efficiencies superior to those of Cu(In,Ga)Se solar cells. Solar cells based on a $Cu_2ZnSn(S,Se)_4$ absorber layer prepared by vacuum deposition techniques have reached efficiencies of 9.7% (T. Todorov et al., Advanced Materials, 22, E156-9 (2010)). Other low-cost thin film deposition methods have been employed in an effort to reduce production costs, such as electrodeposition (S. Pawar et al., Electrochimica Acta, 55, 4057-4061 (2010); S. Nakamura and A. Yamamoto, Solar Energy Materials and Solar Cells, 1997, 49, 415-421), and spray deposition (Y. Kishore et al., Solar Energy Materials and Solar Cells, 93, 1230-7 (2009); (Albert Goossens and Joris, H. Nanotechnology, 19 (2008) 424018).

Recently, photovoltaics based on solution-processed nanoparticles have attracted attention, such nanoparticles having advantageous handling characteristics. Li et al. fabricated $CuInS_2$ solar cells using an in situ nanoparticle synthetic method and obtained an efficiency of up to about 4% (Li, L.; Coates, N.; Moses, D. J. Am. Chem. Soc. 2009, 132, 22). Nanoparticle ink has the advantage of mono-dispersion in organic solvents for coating, but almost all reported nanoparticles have been found to need rebuilding crystallinity and stoichiometry via annihilation, a process that needs to be carried out at a relatively high temperature, often as high as 600° C., and in a controlled environment containing ambient sulfur and selenium. The encapsulating organic ligands used for stable dispersion of nanoparticles are "burned out" by the annihilation process leaving unwanted residues that lower the particles' photovoltaic L.; Dodabalapur, A.; Barbara, P. F.; Korgel, B. A. J. Am. Chem. Soc. 2008, 130, 16770.). In addition to all this, current methods for producing $CuInS_2$ and $Cu_2ZnSnS_4$ nanocrystals are usually air-sensitive and generally carried out using a Schlenk-line or equivalent apparatus.

SUMMARY

The inventors have succeeded in producing copper- and sulfur-containing nanoparticles by a method that does not require pressure reduced below atmospheric pressure, nor does the method require the use of a protective atmosphere to obtain nanocrystals that are preferred for practical application, such as in a photovoltaic device. It is possible to carry out the method as a "one-pot" synthesis.

In one embodiment, nanoparticles comprising copper, sulfur and optionally selenium, and a first other metal or first and second other metals are formed. A method of forming the nanoparticles involves reacting one or the other or both of $Cu^{1+}$ and $Cu^{2+}$, a compound of the first other metal or a compound of the first and second other metals, and a thiourea, in the presence of a capping agent of the formula ArSH and a reducing solvent system and optionally a selenium source, to form a mixture containing nanoparticles.

The nanoparticle can include the first and second metals in which the first metal is tin and the second metal is zinc. The compound of the first metal can be one or more of $SnCl_2$, $SnBr_2$, $SnF_2$, $SnI_2$, $Sn(NO_3)_2$, $Sn(ClO_4)_2$, $SnSO_4$, tin(II)acetate, tin(II) acetate hydrate, tin(II) acetylacetonate, and tin (II) tris(trifluoromethanesulfonimide). The compound of the first metal can be one or more of $SnCl_4$, $SnBr_4$, $SnF_4$, $SnI_4$, $Sn(NO_3)_4$, $Sn(ClO_4)_4$, $Sn(SO_4)_2$, tin(IV)acetate, tin(IV) acetate hydrate, tin(IV) acetylacetonate, and tin(IV) tris(trifluoromethanesulfonimide). The compound of the second metal can be one or more of $ZnCl_2$, $ZnBr_2$, $ZnF_2$, $ZnI_2$, $Zn(NO_3)_2$, $Zn(ClO_4)_2$, $ZnSO_4$, zinc(II)acetate, zinc(II) acetate hydrate, zinc(II) acetylacetonate, and zinc(II) tris(trifluoromethanesulfonimide).

In a particular embodiment, nanoparticles comprise $Cu_2ZnSnS_4$.

When selenium is formed as part of a nanoparticle the selenium source in the reaction can be is one or more of $H_2SeO_3$, $H_2SeO_4$, $Na_2SeO_3$, $Na_2Se$, $H_2Se$, $Na_2SeO_4$, $Na_2SSeO_3$, and $H_2SSeO_3$. An embodiment thus includes formation of nanoparticles comprising $Cu_2ZnSn(S_{(1-x)}Se_x)_4$ wherein $0 \leq x \leq 1$. In embodiments, x can be about 0.25, 0.5 or 0.75, or other values as described herein.

Method includes forming an inorganic nanoparticle comprising copper, sulfur and the first other metal where the first other metal is tin. An example of such a nanoparticle is $Cu_2SnS_3$.

in another embodiment, the method includes forming an inorganic nanoparticle comprising copper, sulfur and the first other metal, and optionally selenium, wherein the first other metal is indium. The source compound of the first metal can be one or more of $InCl_3$, $InBr_3$, $InF_3$, $InI_3$, $In(NO_3)_3$, $In(ClO_4)_3$, $In_2(SO_4)_3$, indium(III)acetate, indium (III) acetate hydrate, indium(III) acetylacetonate, indium(III) and tris(trifluoromethanesulfonimide). An example of such nanoparticles is $CuInS_2$.

When selenium is included, the nanoparticle has the formula $CuIn(S_{(1-x)}Se_x)_2$ wherein $0 \leq x < 1$.

In certain embodiments, the solvent system boils at a first temperature, and the reaction temperature of the reacting step is below the first temperature. The difference between the first temperature and the reaction can be, for example, at least 5° C.

The reaction in which the nanocrystals are formed can be carried out at ambient pressure or greater, but the choice of pressure of the reaction is optional.

The first temperature can be, for example, at least 160° C. The second temperature can be at least 120° C. It is also possible, for example for the reacting step to be carried out at ambient pressure, where the first temperature is at least 200° C., and the reaction temperature is at least 160° C. A reacting step can also be carried out between 170° C. and 190° C., etc.

In an embodiment the solvent system contains benzyl alcohol, and the reaction temperature is in the range of 160° C. and 200° C., or between 170° C. and 190° C.

In a particular embodiment, the $Cu^{2+}$ compound is Cu(Acac), the $Cu^{1+}$ compound is CuCl, the $Zn^{2+}$ compound is $ZnCl_2$, the $Sn^{2+}$ compound is $SnCl_2$, the $Sn^{4+}$ compound is $SnCl_4$ the capping agent is 2-mercapto-5-n-propylpyrimidine, and the thiourea is a compound of the formula $NH_2C(S)NH_2$.

In an embodiment, the method includes preparing $CuInS_2$ nanoparticles, by reacting, in a reducing solvent system, a (i) $Cu^{1+}$ $Cu^{2+}$ compound, (ii) an $In^{3+}$ compound, (iii) a capping agent of the formula ArSH, and (iv) a thiourea. The method can include a step of adding (iv) to a mixture of (i), (ii), (iii) in the reducing solvent system, and (iv) can be contained in the solvent system prior to addition to the mixture. In a particular case, the molar ratio of (i):(ii):(iv) is about 1:1:2 measured as Cu:In:S and/or the molar ratio of (i):(iii) is between about 1:1 and about 1:2.

A compound of formula ArSH can be one, or possibly a mixture, in which Ar is aryl or heteroaryl. An example of ArSH is 2-mercapto-5-n-propylpyrimidine, this compound having been used in examples described in greater detail below.

In one embodiment, the $Cu^{2+}$ compound is Cu(Acac), the $In^{3+}$ compound is $InCl_3$, the capping agent is 2-mercapto-5-n-propylpyrimidine, and the thiourea is a compound of the formula $NH_2C(S)NH_2$.

Another embodiment is method of preparing $Cu_2ZnSnS_4$ nanoparticles that includes the step of reacting, in a reducing solvent system, a (i) $Cu^{1+}$ or $Cu^{2+}$ compound, (ii) a $Zn^{2+}$ compound, (iii) a $Sn^{2+}$ or $Sn^{4+}$ compound, (iv) a capping agent of the formula ArSH, and (v) a thiourea. The method can include a step of adding (v) to a mixture of (i), (ii), (iii), (iv) in the reducing solvent system and/or (v) can be contained in the solvent system prior to addition to the mixture. The molar ratio of (i):(ii):(iii):(iv) can be selected to be about 2:1:1:4, measured as Cu:Zn:Sn:S. The molar ratio of (i):(iv) can be between about 1:1 and about 1:2.

As indicated above, the reacting step can include heating the reducing solvent system, and of course can be followed by cooling or permitting to cool the mixture of the nanoparticles and solvent system.

The reaction can be carried out with the reaction mixture being free of an alkylamine, free of elemental sulfur, and/or free of an alkenylamine.

The method typically includes a step of separating the formed nanoparticles from the solvent system and by-products of the reaction. One way of accomplishing this includes centrifuging the mixture of the nanoparticles and solvent system followed by removal of the solvent system and by-products it contains.

Methods can include isolating nanoparticles formed as nanocrystals in the reacting step.

The nanoparticles can be isolated as a monodispersion, and the nanoparticles can have an index of dispersion of, for example, between 7 and 1.

Nanocrystals that have a distribution quotient ($D_Q$) that is less than 3 can be obtained.

Isolated nanocrystals can be packaged for use as a photodetector. The photodetector can be a component of a solar cell.

Nanocrystals can be packaged for being airbrushed, drop-cast, dip-coated, electrophoretically deposited spin-coated, painted, sprayed, deposited, or printed onto a substrate for incorporation into a solar cell.

Nanocrystals can be packaged as an ink.

The thiourea can be a thiocarbazide or a thiosemicarbazide or a mixture thereof.

The thiourea can be a compound having formula (I):

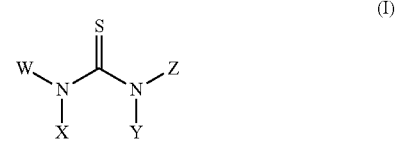

W, X, Y and Z are, independently of each other, H, R, —NRR wherein, if one or the other of W and X is —NRR, then the other of W and X is not —NRR, if one or the other of Y and Z is —NRR, then the other of Y and Z is not —NRR, and each R is, independently, H, alkyl, alkenyl, alkynyl, aryl, or —C(O)R, and wherein each R is optionally substituted and wherein —NRR can be iminyl in which the carbon atom of the imine unsaturation can be substituted or unsubstituted.

A $Cu^{1+}$ compound of the reaction can be any one or more of CuCl, CuBr, a hydrate of CuCl, CuF, CuF, a hydrate of CuF, $CuNbO_3$, $CuNO_3 2.5H_2O$, $Cu_2O$, $CuNO_3$ or a hydrate thereof, $CuClO_4$ or a hydrate thereof, $Cu_2SO_4$, copper (I) thiophenolate, copper(I) trifluoromethanesulfonate toluene, tetrakis(acetonitrile)copper(I) hexafluorophosphate, and a combination of any of the foregoing.

A $Cu^{2+}$ compound of the reaction can be any one or more of $Cu(Acac)_2$, $CuBr_2$, $CuCO_3.Cu(OH)_2$, $CuCl_2$, $CuCl_2.2H_2O$, $CuF_2$, a hydrate of $CuF_2$, $Cu(NbO_3)_2$, $CuMoO_4$, $Cu(NO_3)_2.2.5H_2O$, CuO, $Cu(NO_3)_2.3H_2O$, $Cu(ClO_4)_2.6H_2O$, $Cu_2P_2O_7$ or a hydrate thereof, $CuSO_4$, copper(II) 2-ethylhexanoate, copper(II) 2-pyrazinecarboxylate, copper(II) acetate hydrate, copper(II)trifluoroacetylacetonate, bis(ethylene-diamine)copper(II) hydroxide, and a combination of any of the foregoing.

The reacting step can be carried out at a reaction temperature such that nanocrystals are formed in the reacting step within less than 4 hours, or for example, such that nanocrystals are formed in the reacting step within less than 3 hours, 1 hour or ½ hour.

The solvent system can include propylene carbonate.

The reducing solvent system can be a hydroxylic solvent, examples being a 1° alcohol, a 2° alcohol, a 3° alcohol, or a mixture of any of the foregoing. The alcohol can include an aromatic group. Such aromatic group can be covalently bonded to the hydroxyl group at a carbon in an alpha position with respect to the hydroxyl group.

Examples of solvent system components include benzyl alcohol, 1,2-propyleneglycol, 1,3-propylene glycol, glucose, glycerol, ethylene glycol, propylene carbonate, and mixtures of any of these.

Exemplified embodiments include use the alcohol is benzyl alcohol.

The invention thus also includes products of methods of the invention, including for example, a monodispersion of $CuInS_2$ nanoparticles or other nanoparticle(s) described herein, which are described elsewhere for convenience. Such monodispersion can comprise nanocrystals having index of dispersion of between 7 and 1. A plurality of nanocrystals can have a narrow particle size distribution. The nanocrystals can have a distribution quotient ($D_Q$) that is less than 3.

The invention includes a ligand-capped $CuInS_2$ nanoparticle in which a capping agent ArSH is bound to the surface of the particle. ArSH is, described generally above, can be an optionally 5-substituted 2-mercaptopyrimidine, or more specifically, it can be 2-mercapto-5-n-propylpyrimidine.

Nanoparticles, more advantageously, nanocrystals of the invention can be incorporated as part of an active layer for use in a photovoltaic device.

The invention thus includes a solar cell that includes such a photosensitive active layer.

A particular solar cell includes a first electrode; a composite electron conductor layer electrically coupled to the first electrode, the composite electron conductor layer including a plurality of nanocrystals described herein; an active layer coupled to the composite electron conductor layer; and a second electrode electrically coupled to the active layer.

The invention further includes a method of fabricating a solar cell. This includes, for instance, forming a first electrode; depositing an active layer over the first electrode, the active layer comprising a plurality of nanoparticles; and depositing a second electrode over the active layer.

Methods of the invention can also be characterized as a use, such as, for example, use of a plurality of nanoparticles as described herein in the manufacture of a photovoltaic device or active layer thereof; or use of one or the other or both of $Cu^{1+}$ and $Cu^{2+}$, a compound of the first other metal or a compound of the first and second other metals, and a thiourea, to form a mixture containing nanoparticles in the presence of a capping agent of the formula ArSH and a reducing solvent system, etc. Such uses are understood as being disclosed by the description of methods, and are not repeated here.

It is also understood that various components, such as ArSH, reducing solvents, metal compounds, thioureas, selenium sources, temperature ranges, described in connection with particular embodiments, can be included in combination with elements of other specifically described embodiments to obtain other embodiments of the invention.

BRIEF DESCRIPTION OF THE DRAWINGS

Reference is made to the accompanying figures which illustrate aspects of the invention, and together with the remainder of the specification serve to explain the principles of the invention.

DETAILED DESCRIPTION

Figure 1:
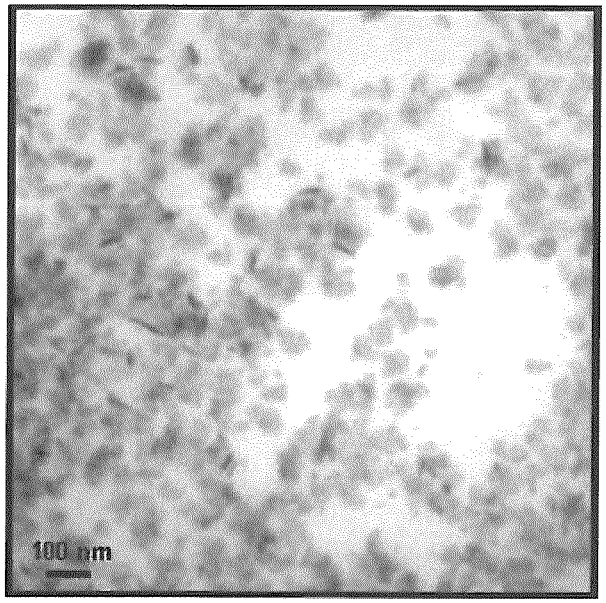
FIG. 1 shows TEM (transmission electron microscope) image of $CuInS_2$ nanocrystals prepared according to the method of Example 1: (a) (b)

The invention includes methods for producing $Cu_2ZnSnS_4$, $Cu_2ZnSn(S_{(1-x)}Se_x)_4$, $Cu_2SnS_3$, $CuInS_2$, and $CuIn(S_{(1-x)}Se_x)_2$ nanocrystals, as exemplified below. It is possible to carry out the method as a "one-pot" synthesis.

Definitions

A "$Zn^{2+}$" compound is a compound in which zinc exists in an oxidation state of +2. The compound can be an inorganic compound, or can be a coordination complex in which zinc is bound to one or more organic ligands. The compound can be a mixed complex that includes one or more elements e.g., inorganic ion(s) in addition to organic ligand(s). Examples of inorganic $Zn^{2+}$ compounds include $ZnCl_2$, $ZnBr_3$, $ZnF_2$, $ZnI_2$, $Zn(NO_3)_2$, $Zn(ClO_4)_2$, $ZnSO_4$, etc. Examples of $Zn^{2+}$ complexes in which zinc is complexed by one or more organic ligands include zinc(II)acetate, zinc (II) acetate hydrate, zinc (II) acetylacetonate, zinc(II) tris(trifluoromethanesulfonimide), etc.

A "$Sn^{2+}$" or a "$Sn^{4+}$" compound is a compound in which tin exists in an oxidation state of +2 or +4. The compound can be an inorganic compound, or can be a coordination complex in which tin is bound to one or more organic ligands. The compound can be a mixed complex that includes one or more elements e.g., inorganic ion(s) in addition to organic ligand(s). Examples of inorganic $Sn^{2+}$ compounds include $SnCl_2$, $SnBr_3$, $SnF_2$, $SnI_2$, $Sn(NO_3)_2$, $Sn(ClO_4)_2$, $SnSO_4$, etc. Examples of $Sn^{2+}$ complexes in which tin is complexed by one or more organic ligands include tin(II)acetate, tin (II) acetate hydrate, tin(II) acetylacetonate, tin(II) tris(trifluoromethanesulfonimide), etc. Examples of inorganic $Sn^{4+}$ compounds include $SnCl_4$, $SnBr_4$, $SnF_4$, $SnI_4$, $Sn(NO_3)_4$, $Sn(SO_4)_2$, $SnS_2$, etc.

An "$In^{3+}$" compound is a compound in which indium exists in an oxidation state of +3. The compound can be an inorganic compound, or can be a coordination complex in which indium is bound to one or more organic ligands. The compound can be a mixed complex that includes one or more elements e.g., inorganic ion(s) in addition to organic ligand(s). Examples of inorganic $In^{3+}$ compounds include $InCl_3$, $InBr_3$, $InF_3$, $InI_3$, $In(NO_3)_3$, $In(ClO_4)_3$, $In_2(SO_4)_3$, etc. Examples of $In^{3+}$ complexes in which indium is complexed by one or more organic ligands include indium(III)acetate, indium (III) acetate hydrate, indium(III) acetylacetonate, indium(III) tris(trifluoromethanesulfonimide), etc.

A "selenium source" is one or more of $H_2SeO_3$, $H_2SeO_4$, $Na_2SeO_3$, $Na_2Se$, $H_2Se$, $Na_2SeO_4$, $Na_2SSeO_3$, $H_2SSeO_3$, etc.

In representing particles containing sulfur and optionally selenium, the amounts of the two components are designated by the formula $(S_{(1-x)}Se_x))_n$ in which n is a whole number designating the total number of sulfur and selenium atoms. The value of x can be 0 (no selenium present) to 1 (no sulfur present) i.e. $0 \leq x \leq 1$ so, for example, when n is 2 and x=0.5 the number of sulfur atoms represented by the formula is one and the number of selenium atoms represented by the formula is one. When n=0, there is no selenium present. The value of x can be any number between 1 and 0, particularly about any of 0.05, 0.1, 0.2, 0.3, 0.4, 0.5, 0.6, 0.7, 0.8, 0.9, 0.95 etc. and can be selected according to cost, desired properties of the product, etc. Exemplary values of x include 0.25n, 0.5n and 0.75n. When n is 2, exemplary values x are 0.25, 0.5 and 0.75, with x equaling about 0.5 providing stoichiometric equality between sulfur and selenium. When n is 4, values of x of 0.25, 0.5 and 0.75 provide S/Se ratios of 3:1, 1:1 and 1:3, respectively. When both sulfur and selenium are required to be present, $0<x<1$. Use of the designation "$(S_{(1-x)}Se_x))_n$" without an accompanying value for x indicates that the range of x is $0 \leq x \leq 1$. For a particular nanocrystals product of course, the value of x is preferably a single value in a designated range.

A "capping agent" of the present invention is an organic compound having the formula ArSH in which Ar is a radical having an aromatic group in which the aromatic group is covalently bonded directly to the SH radical (sulfhydryl or thiol group).

Aromatic groups such as the organic aromatic groups phenyl, pyrimidyl, etc. are known in the art. Aromatic groups include the aryl and heteroaryl groups described herein.

"Aryl" refers to a monovalent aromatic hydrocarbon group obtained by the removal of one hydrogen atom from a single carbon atom of an aromatic ring system. The group, which may be substituted, includes an aromatic system containing one, two or three rings wherein the rings may be attached together in a pendant manner or may be fused and contains 6 to 16 ring carbon atoms. Examples include phenyl, naphthyl, tetrahydronaphthyl, indane, biphenyl, and the like. Families of such aryl groups are designated $C_6$-$C_{16}$-aryl, $C_6$-$C_{14}$-aryl, $C_6$-$C_{12}$-aryl, $C_6$-$C_{10}$-aryl, $C_6$-$C_8$-aryl, $C_8$-$C_{16}$-aryl, $C_8$-$C_{14}$-aryl, etc.

"Heteroaryl" refers to a monovalent aromatic group obtained by removal of one hydrogen atom from an aromatic ring member having 1, 2, 3 or 4 heteroatoms. Heteroatoms are N, S or O, and the heterocyclic radical is bound via a carbon atom or a nitrogen atom. The group, which may be substituted, includes monocyclic or fused bicyclic or tricyclic aromatic ring assemblies containing 5 to 16 ring atoms. Examples include pyridyl, pyrimidyl, benzothienyl, benzofuranyl, pyrazolyl, imidazolyl, thienyl, etc. Families of such aryl groups are designated $C_5$-$C_{16}$-heteroaryl, $C_5$-$C_{14}$-heteroaryl, $C_6$-$C_{16}$-heteroaryl, $C_6$-$C_{12}$-heteroaryl, $C_6$-$C_8$-heteroaryl, etc. In the context of the capping agent of this invention, preferred members of the group of compounds represented by ArSH are the 2-mercapto-pyrimidines, specifically 2-mercapto-5-n-propylpyrimidine used in the examples. Other examples of the ArSH are substituted pyrimidines e.g., 2-mercapto-5-R-pyrimidines in which R is a C1-C10 alkyl group, that may be optionally substituted.

R-groups, including e.g., alkyl and aromatic groups may bear substituents i.e., have covalently bonded thereto other substituent groups. Aryl and heteroaryl groups, for example, can thus be substituted with halogen (F, Cl, Br, I), —OR', —OC(O)R', —NR'R", —SR', —R', —CN, —NO$_2$, —CO$_2$R', —CONR'R", —R', —CN, —NO$_2$, —CO$_2$R', —CONR'R", —C(O)R', —OC(O)NR'R", —NR"C(O)R', —C(O)R', —OC(O)NR'R", —NR"C(O)R', —NR"C(O)$_2$R', —NR'—C(O)NR"R'", —NH—C(NH$_2$)=NH, —NR'C(NH$_2$)=NH, —NH—C(NH$_2$)=NR', —S(O)R', —S(O)$_2$R', —S(O)$_2$NR'R", —N$_3$, —CH(Ph)$_2$, perfluoro($C_1$-$C_4$)alkoxy, and perfluoro($C_1$-$C_4$)alkyl. If optionally substituted, the number of substituents can be zero up to a total of the number of open valences in the aromatic group. An open valence in the unsubstituted aromatic group is an atom of the group bonded to a hydrogen that can be replaced by the substituent. Here, R', R" and R'" are C1-C10 alkyl, branched or straight chain or C3-C10 cyclic.

In the description of pendant organic groups or radicals, the skilled person will understand the presence of one or more points of attachment of the group within a larger compound according to the context of the description. For example, a monovalent radical e.g., and alkyl group is incorporated into a compound by means of single a covalent bond, which bond is not always represented in the description of the group per se. The representations of a monovalent alkyl group as "R" or "—R" for example are thus equivalent to each other as context would dictate.

A capping agent of the invention has a dimensional requirement, the nominal calculated distance "D" between the sulfur atom ("S" of "ZSH") and the most distant atom within the agent being at least 3.8 Å. Preferably, D would be at least 3.8 Å, and no more than 10.0 Å.

A "sulfur donor" is the component of the reaction mixture that provides the sulfur of the resulting nanocrystal $Cu_2ZnSnS_4$, excluding the capping agent. There can be more than one sulfur donor. Thiourea was found to be particularly suitable. Other sulfur donors include other thiourea compounds including thiocarbazide and thiosemicarbazide.

Singular forms "a," "an" and "the" include plural referents unless the context clearly dictates otherwise. For example, reference to "a solvent" would include a mixture of two or more solvents.

The term "about", when used in conjunction with ranges of dimensions, temperatures or other physical properties or characteristics is used as it would be by a skilled person in a similar context, unless otherwise specified. Typically, the term is meant to cover slight variations that may exist in the upper and lower limits of the ranges of dimensions so as to not exclude embodiments where on average most of the dimensions are satisfied but where statistically dimensions may exist outside this region.

A nanoparticle (or a nanocrystal) is a particle (crystal) having a maximum dimension of less than 1 μm, and nanoparticles (nanocrystals) is a plurality of particles (crystals) the mean size of which particles (crystals) is less than 1.0 μm. Preferred size ranges of nanoparticles, or nanocrystals, are 1 to 10 nm, 10 to 500 nm, 10 to 200 nm, 10 to 150 nm, 10 to 100 nm, 20 to 90 nm, 20 to 70 nm, 30 to 70 nm, 30 to 60 nm, and 40 to 60 nm. A "nanocrystal" refers to a nanoparticle having an ordered crystalline structure.

$Cu_2ZnSnS_4$, $Cu_2ZnSn(S_{(1-x)}Se_x)_4$, $Cu_2SnS_3$, $CuInS_2$, or $CuIn(S_{(1-x)}Se_x)_2$ nanocrystals can be obtained by the present methods which are especially suitable for photovoltaic use, so an aspect of the present invention relates to $Cu_2ZnSnS_4$, $Cu_2ZnSn(S_{(1-x)}Se_x)_4$, $Cu_2SnS_3$, $CuInS_2$, or $CuIn(S_{(1-x)}Se_x)_2$ nanocrystals and their use in devices, such as, for example, photovoltaic devices. A particular aspect of the invention is production of a light-absorbing layer using nanocrystals obtained by the inventors' method. Another particular aspect is the self-assembly of the nanocrystals wherein a preferential increase in the collective photoactivity of the nanocrystals is obtained.

Another aspect of the invention is a composition containing any of $Cu_2ZnSnS_4$, $Cu_2ZnSn(S_{(1-x)}Se_x)_4$, $Cu_2SnS_3$, $CuInS_2$, and $CuIn(S_{(1-x)}Se_x)_2$ nanocrystals, wherein the composition is suitable for being drop-cast, dip-coated, spin-coated, sprayed, airbrushed, electrophoretically deposited, and/or printed onto a substrate. A particular aspect is ink containing $Cu_2ZnSnS_4$, $Cu_2ZnSn(S_{(1-x)}Se_x)_4$, $Cu_2SnS_3$, $CuInS_2$, or $CuIn(S_{(1-x)}Se_x)_2$ nanocrystals. An "ink" of the invention refers to a dispersion of nanoparticles within a liquid, such as, for example, a solvent or vehicle system, unless specifically stated to the contrary.

Nanocrystals of the invention are produced in a reducing solvent system, i.e., the system, which is a liquid, takes part in the reaction by providing a reductant. In the disclosed embodiments, the solvent system is provided by benzyl alcohol, but the system need not be limited to a single reductant, and other liquid systems are available, such as a mixture containing other components e.g., benzyl alcohol and glycerol. One consideration in formulation of the solvent system is the boiling point of the system under the conditions at which the reaction to form nanocrystals is to be conducted. So, if the reaction is to be carried out at ambient pressure, and it is desired to carry the reaction out at a temperature at which the system is not boiling, then the temperature at which a selected solvent system boils would be above the reaction temperature. Preferably, the difference would be at least 5° C., but could be at least 10° C., 15° C., 20° C., 25° C., 30° C., or greater.

The solvent system thus provides a reactant, and also provides a reaction medium by at least partially solubilizing other reactants to permit formation of the nanocrystals. Benzyl alcohol has been found to be suitable, but other solvents include propylene carbonate. It is thought that hydroxylic solvents are suitable, and other possible solvents include ethylene glycol, 1,2-propylene glycol, 1,3-propylene glycol, glycerol, ethylene glycol, or glucose. It is thought that the reducing solvent, by participating in the reaction, contributes to the observed stoichiometric formation of nanocrystals in which copper has an oxidation number of +1. The examples described below used benzyl alcohol which has a boiling point around 205° C., at ambient pressure. The temperature of the reaction mixture was maintained below the boiling point, at about 180° C. It is thought to be preferable to carry out the reaction in a solvent (or solvent mixture) below the boiling of the solvent.

The reaction of the disclosed embodiments was carried out at 180° C. and the boiling of the reducing solvent, benzyl alcohol, is about 205° C. at ambient pressure. This was found to be satisfactory, given the precursor materials used, and their relative amounts, and product nanocrystals were formed within 10 minutes. The reaction can be carried out at other temperatures. Lowering the temperature will lower the rate of particle formation, and raising the temperature will hasten particle formation. The reaction is carried out at a temperature of at least 30° C., at least 40° C., at least 50° C., at least 60° C., at least 70° C., at least 80° C., at least 90° C., at least 100° C., at least 110° C., at least 120° C., at least 130° C., at least 140° C., at least 150° C., at least 160° C., at least 170° C., at least 180° C., at least 190° C., or at least 200° C., which includes carrying out nanocrystal formation at about any of the fore-listed reaction temperatures, where "about" in this context means±5° C.

Accordingly, the reducing solvent system can include a hydroxylic solvent. The hydroxylic solvent can be a 1° alcohol, a 2° alcohol, a 3° alcohol, or a mixture of any of the foregoing. The alcohol can include an aromatic group. The aromatic group can be covalently bonded to the hydroxyl group at a carbon in an alpha position with respect to the hydroxyl group, as in the case of benzyl alcohol.

In one aspect of the invention, the solvent system boils at a first temperature, and the reaction temperature of the reacting step is below the first temperature. The difference between the first temperature and the reaction temperature can be at least 5° C. The first temperature is preferably at least 140° C. The reaction temperature is preferably at least 120° C. More preferably, the reacting step is carried out at ambient pressure, the first temperature is at least 200° C., and the reaction temperature is at least 160° C. More preferably, the solvent system includes benzyl alcohol, and the reaction temperature is in the range of 160° C. and 200° C., more preferably still the reacting step is carried out between 170° C. and 190° C. In the context of this invention a "$Cu^{1+}$ or $Cu^{2+}$ compound" is a precursor compound in which the copper exists in an oxidation state of +1 or +2. The compound can be an inorganic compound, or can be a coordination complex in which the metal is bound to one or more organic ligands. The compound can be a mixed complex that includes one or more elements e.g., inorganic ion(s) in addition to organic ligand(s). It is important that the $Cu^{1+}$ or $Cu^{2+}$ compound be at least partially soluble in the reducing solvent system so that $Cu_2ZnSnS_4$ nanocrystal formation can occur.

Examples of inorganic $Cu^{1+}$ compounds include CuBr, CuCl, CuF, $CuF_2$. or a hydrate of $CuF_2$, $CuNbO_3$, $CuNO_3$ or a hydrate thereof, $Cu_2O$, $CuClO_4 \cdot 6H_2O$, $Cu_4P_2O_7$ or a hydrate thereof, $Cu_2SO_4$, etc. Examples of $Cu^{1+}$ complexes in which the copper is complexed by one or more organic ligands include copper (I) thiophenolate, copper(I) trifluoromethanesulfonate toluene, tetrakis(acetonitrile)copper(I) hexafluorophosphate, etc.

Examples of Cu(II) compounds comprising both organic ligand(s) and other elements include bis(ethylenediamine) copper(II) hydroxide, etc. The skilled person understands that the terms cupric, $Cu^{2+}$, copper(II), etc. are used in different contexts, and denote copper in an oxidation state of +2.

Examples of inorganic $Cu^{2+}$ compounds include $CuBr_2$, $CuCO_3 \cdot Cu(OH)_2$, $CuCl_2$, $CuCl_2 \cdot 2H_2O$, $CuF_2$, $CuF_2$. or a hydrate of $CuF_2$, $Cu(NbO_3)_2$, $CuMoO_4$, $Cu(NO_3)_2 \cdot 2.5H_2O$, CuO, $Cu(NO_3)_2 \cdot 3H_2O$, $Cu(ClO_4)_2 \cdot 6H_2O$, $Cu_2P_2O_7$ or a hydrate thereof, $CuSO_4$, etc. Examples of $Cu^{2+}$ complexes in which the copper is complexed by one or more organic ligands include copper(II) 2-ethylhexanoate, copper(II) 2-pyrazinecarboxylate, copper(II) acetate hydrate, copper(II) trifluoroacetylacetonate, etc. Copper(II) acetylacetonate was used in examples described herein, and was found to be suitable for the purposes of this invention. Examples of Cu(II) compounds comprising both organic ligand(s) and other elements include bis(ethylenediamine)copper(II) hydroxide, etc. The skilled person understands that the terms cupric, $Cu^{2+}$, copper(II), etc. are used in different contexts, and denote copper in an oxidation state of +2.

A sulfur donor is, generally speaking, an organic compound that is a thiourea, and the thiourea can be substituted or unsubstituted. Thiourea itself has the molecular formula $NH_2C(=S)NH_2$. A thiourea compound contains the nucleus N—C(S)—N. According to a particular embodiment, a thiourea is a compound having formula (I):

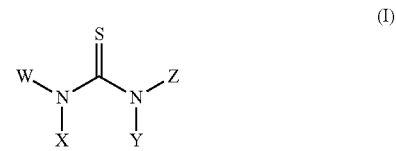

W, X, Y and Z are, independently of each other, H, R, —NRR wherein, if one or the other of W and X is —NRR, then the other of W and X is not —NRR, if one or the other of Y and Z is —NRR, then the other of Y and Z is not —NRR, and each R is, independently, H, alkyl, alkenyl, alkynyl, aromatic, or —C(O)R, and wherein each R is optionally substituted and wherein —NRR can be iminyl in which the carbon atom of the imine unsaturation can be substituted or unsubstituted.

Examples of thioureas are 2-(2,4-dichlorophenyl)-N-(2-methoxyphenyl)hydrazine-carbothioamide, 1,3-diisopropyl-2-thiourea, (3,5-dimethylphenyl)thiourea, (2,5-difluorophenyl)thiourea, N,N'-Diphenylthiourea, 1,1-diethyl-3-phenyl-2-thiourea, N-ethylthiourea, and N,N'-diethylthiourea.

The reactions of the examples, in which $Cu_2ZnSnS_4$ and $CuInS_2$ formed, were carried out at ambient (atmospheric) pressure, and precautions e.g., the use of a Schlenk line, to exclude oxygen or provide a specialized atmosphere were not taken. It was thus found possible to form nanocrystals that can be incorporated into a photovoltaic device in which $Cu_2ZnSnS_4$ and $CuInS_2$ formation occurred at atmospheric pressure. Further it was found possible to form the crystals in the presence of atmospheric oxygen. This is not say that either of these is essential to the reaction. The skilled person might choose to reduce the amount of or exclude oxygen altogether. There may also be advantages to e.g., use of reduced pressure in the removal of solvent in purification steps e.g., during the removal impurities that coexist with the crystals in a reaction product mixture.

In choosing the combination of reactants, the solubilities of the zinc precursor(s), tin precursor(s), indium precursor(s) and copper precursor(s), as the case may be, in the reducing solvent system is a factor that can be taken into account since increased solubility might aid the reaction. Those skilled in the art are also aware that the solubility of a precursor will generally increase with increasing temperature of a solvent. Preferably, the solubility of the inorganic salt of a copper, zinc or tin precursor will be at least 0.0001 g/100 g of water at 25° C., more preferably at least 0.001 g/100 g, more preferably at least 0.01 g/100 g, more preferably at least 0.05 g/100 g, more preferably at least 0.1 g/100 g, more preferably at least 0.5 g/100 g, more preferably at least 1 g/100 g, more preferably at least 5 g/100 g, more preferably at least 10 g/100 g, and more preferably at least 25 g/100 g of water.

In the disclosed examples involving $Cu_2ZnSnS_4$, the method includes a step of adding a thiourea to a prepared mixture of the copper(II), zinc(II), tin(II) and capping agent, and the thiourea compound itself was prepared in a portion of the solvent system for addition to the reaction mixture. Preferably, the molar ratio of $Cu^{2+}:Zn^{2+}:Sn^{2+}$:sulfur donor, $Cu^{1+}:Zn^{2+}:Sn^{2+}$:sulfur donor, $Cu^{2+}:Zn^{2+}:Sn^{4+}$:sulfur donor and $Cu^{1+}:Zn^{2+}:Sn^{4+}$:sulfur donor are about 2:1:1:4 measured as Cu:Zn:Sn:S. Preferably, the molar ratio of $Cu^{2+}$:capping agent and $Cu^{1+}$:capping agent is between about 1:1 and about 1:2.

In the disclosed examples involving $CuInS_2$, the method includes a step of adding a thiourea to a prepared mixture of the copper(II), indium(III) and capping agent, and the thiourea compound itself was prepared in a portion of the solvent system for addition to the reaction mixture. Preferably, the molar ratio of $Cu^{2+}:In^{3+}$:sulfur donor is about 1:1:2 measured as Cu:In:S. Preferably, the molar ratio of $Cu^{2+}$:capping agent is between about 1:1 and about 1:2.

Typically, the reaction mixture is heated so that the reacting step takes place in the reducing solvent system at a temperature elevated above ambient.

Once the nanoparticles/nanocrystals are formed, the reaction mixture is usually cooled, or allowed to cool by awaiting an appropriate length of time, before the nanoparticles product is separated from the solvent system, reaction byproducts, etc.

According to preferred embodiments, the reaction is carried out with the reaction mixture being substantially free of alkylamines, alkenylamines, and elemental sulfur. By "substantially free" is meant that no such component is added to the reaction mixture other than that which might be present in very small amounts in starting materials, as might be the product of the manufacture of those materials.

In the preferred embodiment, cleaning up the reaction mixture includes centrifuging the reaction products to obtain sediment containing the e.g., $Cu_2ZnSnS_4$ or $CuInS_2$ product with byproducts in the supernatant which can then be separated from the product by separation of the liquid solvent system from the sediment.

It is typical for the e.g., $Cu_2ZnSnS_4$ or $CuInS_2$ product nanoparticles to be obtained in an isolated form. An "isolated" ligand-capped $Cu_2ZnSnS_4$ nanoparticle of the invention is one from which byproducts produced during its formation have been removed, but it is not necessarily simply a composition of nanoparticles. The composition can include components combined with the nanoparticles after being separated from undesired byproducts.

A particularly preferred isolated form of nanoparticles of the invention is a monodispersion of nanocrystals.

An advantage of the invention is the formation of nanocrystals that can be put to practical use without the need for the step of burning out byproducts of the reaction in which the crystals are formed. It is possible to form a monodispersion of nanocrystals. The "index of dispersion degree" is defined as the average particle size of the secondary (or aggregated) particles (which is normally analyzed by dynamic light scattering (DLS) ($d_{DLS}$)) divided by the average primary particle size of the particles (which is normally analyzed by transmission electron microscope (TEM) ($d_{TEM}$)). The smaller the index of dispersion degree, the closer the dispersion is to a monodispersion. For the purposes of this invention, a monodispersion is a dispersion having an index of dispersion degree of between 7 and 1. More preferably, index of dispersion is between 6 and 1, or it can be between 5 and 1, or 4 and 1. Generally, the term "monodispersion" means that the particles loaded in the liquid medium do not substantially agglomerate or clump together with other particles but remain substantially dispersed in the liquid medium.

Another advantage of the invention is the formation of nanocrystals having a "narrow particle size distribution". The size distribution of the precipitate particles in a given composition may be represented on a SediGraph which is a plot of cumulative mass percent as a function of particle size. Where cumulative mass percent is the percent, by weight, of a distribution having a particle size of less than or equal to a given value and where particle size is the diameter of an equivalent spherical particle. The mean particle size in a distribution is the size of the precipitate particles at the 50% point on the SediGraph for that distribution. The width of the particle size distribution of a given composition can be characterized using a distribution quotient. The distribution quotient, "$D_Q$", is defined as the average diameter of the particles in the ninetieth mass percentile ($D_{90}$) divided by the average diameter of the particles in the tenth mass percentile ($D_{10}$) i.e., $D_Q=(D_{90})/(D_{10})$. In the context of this invention, a narrow size distribution is one in which $D_Q$ is less than about 3, or more preferably less than about 2.

One aspect of the invention includes packaging the nanocrystals for use as a photodetector. The photodetector can be, for example, a component of a solar cell.

Isolated nanocrystals can thus be packaged for being airbrushed, drop-cast, dip-coated, electrophoretically deposited spin-coated, painted, sprayed, deposited, or printed onto a substrate for incorporation into a solar cell. Nanocrystals can be packaged as an ink.

Preferably, the reacting step of the invention is carried out at a reaction temperature such that nanocrystals are formed in the reacting step within less than 4 hours, but this can be less than 3 hours, 1 hour or ½ hour, 20 minutes, or less.

The invention includes a monodispersion of $Cu_2ZnSnS_4$ nanocrystals. The monodispersion of $Cu_2ZnSnS_4$ is preferably a monodispersion of nanocrystals having index of dispersion of between 7 and 1.

The invention includes a monodispersion of $Cu_2ZnSn(S_{(1-x)}Se_x)_4$ nanocrystals. The monodispersion of $Cu_2ZnSn$ $(S_{(1-x)}Se_x)_4$ is preferably a monodispersion of nanocrystals having index of dispersion of between 7 and 1.

The invention includes a monodispersion of $Cu_2SnS_3$ nanocrystals. The monodispersion of $Cu_2SnS_3$ is preferably a monodispersion of nanocrystals having index of dispersion of between 7 and 1.

The invention includes a monodispersion of $CuInS_2$ nanocrystals. The monodispersion of $CuInS_2$ is preferably a monodispersion of nanocrystals having index of dispersion of between 7 and 1.

The invention includes a monodispersion of $CuIn(S_{(1-x)}Se_x)_2$ nanocrystals. The monodispersion of $CuIn(S_{(1-x)}Se_x)_2$ is preferably a monodispersion of nanocrystals having index of dispersion of between 7 and 1.

In embodiments, nanoparticles of $Cu_2ZnSn(S_{(1-x)}Se_x)_4$ or $CuIn(S_{(1-x)}Se_x)_2$, it is possible for $0<x<1$, or for example, $0<x<0.75$, $0<x<0.7$, $0<x<0.6$, $0<x<0.5$, $0<x<0.4$, $0<x<0.3$, $0<x<0.2$, $0<x<0.1$, $0.1<x<1$, $0.1<x<0.8$, $0.1<x<0.6$, $0.2<x<0.9$, $0.2<x<0.7$, $0.2<x<0.5$, $0.3<x<0.7$, etc.

In another aspect, the invention is a produced plurality of $Cu_2ZnSnS_4$ nanocrystals wherein the nanocrystals have a narrow particle size distribution, preferably, a distribution quotient $(D_Q)$ that is less than 3.

In another aspect, the invention is a plurality of nanocrystals of $Cu_2ZnSn(S_{(1-x)}Se_x)_4$ wherein the nanocrystals have a narrow particle size distribution, preferably, a distribution quotient $(D_Q)$ that is less than 3.

In another aspect, the invention is a plurality of nanocrystals of $Cu_2SnS_3$ wherein the nanocrystals have a narrow particle size distribution, preferably, a distribution quotient $(D_Q)$ that is less than 3.

In another aspect, the invention is a plurality of nanocrystals of $CuInS_2$ wherein the nanocrystals have a narrow particle size distribution, preferably, a distribution quotient $(D_Q)$ that is less than 3.

In another aspect, the invention is a plurality of nanocrystals of $CuIn(S_{(1-x)}Se_x)_2$ wherein the nanocrystals have a narrow particle size distribution, preferably, a distribution quotient $(D_Q)$ that is less than 3.

The invention includes a ligand-capped $Cu_2ZnSnS_4$ nanocrystal wherein a cap of the formula ArSH is covalently bound to the surface of the crystal.

The invention includes a ligand-capped $Cu_2ZnSn(S_{(1-x)}Se_x)_4$ nanocrystal wherein a cap of the formula ArSH is covalently bound to the surface of the crystal.

The invention includes a ligand-capped $Cu_2SnS_3$ nanocrystal wherein a cap of the formula ArSH is covalently bound to the surface of the crystal.

The invention includes a ligand-capped $CuInS_2$ nanocrystal wherein a cap of the formula ArSH is covalently bound to the surface of the crystal.

The invention includes a ligand-capped $CuIn(S_{(1-x)}Se_x)_2$ nanocrystal wherein a cap of the formula ArSH is covalently bound to the surface of the crystal.

The invention includes an isolated ligand-capped $Cu_2ZnSnS_4$ nanoparticle wherein a cap of the formula ArSH is bound to the surface of surface of the particle. Accordingly, the invention includes a composition comprising a plurality of nanoparticles in which the nanoparticles are nanocrystals having a narrow particle size distribution, particularly a distribution quotient $(D_Q)$ that is less than 3.

The invention includes an isolated ligand-capped $Cu_2ZnSn(S_{(1-x)}Se_x)_4$ nanoparticle wherein a cap of the formula ArSH is bound to the surface of surface of the particle. Accordingly, the invention includes a composition comprising a plurality of nanoparticles in which the nanoparticles are nanocrystals having a narrow particle size distribution, particularly a distribution quotient $(D_Q)$ that is less than 3.

The invention includes an isolated ligand-capped $Cu_2SnS_3$ nanoparticle wherein a cap of the formula ArSH is bound to the surface of surface of the particle. Accordingly, the invention includes a composition comprising a plurality of nanoparticles in which the nanoparticles are nanocrystals having a narrow particle size distribution, particularly a distribution quotient $(D_Q)$ that is less than 3.

The invention includes an isolated ligand-capped $CuInS_2$ nanoparticle wherein a cap of the formula ArSH is bound to the surface of surface of the particle. Accordingly, the invention includes a composition comprising a plurality of nanoparticles in which the nanoparticles are nanocrystals having a narrow particle size distribution, particularly a distribution quotient $(D_Q)$ that is less than 3.

The invention includes an isolated ligand-capped $CuIn(S_{(1-x)}Se_x)_2$ nanoparticle wherein a cap of the formula ArSH is bound to the surface of surface of the particle. Accordingly, the invention includes a composition comprising a plurality of nanoparticles in which the nanoparticles are nanocrystals having a narrow particle size distribution, particularly a distribution quotient $(D_Q)$ that is less than 3.

The invention thus provides various advantages, one or more of which the skilled person, given this disclosure would be capable of obtaining. The invention can be carried out without the use of a protective environment such as one from which oxygen has been excluded. It is possible to form crystals in a one-pot reaction. It is preferred to add the sulfur donor to a mixture of the liquid reducing system, the copper and indium compounds, and capping agent to obtain the one-pot reaction system.

It will be appreciated that the capping agent of the present invention also has a surfactant property. In the context of the examples described below, the capping agent includes a pyrimidine group which is thought to enhance solubility of product nanocrystals in organic solvents such as the benzyl alcohol used in the examples described below. The ligand may also reduce agglomeration of the nanocrystals to enhance formation of a monodispersion.

It is to be understood that the invention is not limited to specific synthetic methods, particular reagents, etc., which can vary, unless otherwise specified.

In the case of ranges, it is to be understood that each unit between two particular units are also disclosed. For example, if 10 and 15 are disclosed, then 11, 12, 13, and 14 are also disclosed.

Nanoparticles, particularly nanocrystals obtainable by methods disclosed herein are a useful component of a photosensitive active layer for use in a photovoltaic device, the layer comprising i.e., having incorporated thereinto, a plurality of nanoparticles.

A solar cell can include such a photosensitive active layer.

A particular solar cell thus comprises: a first electrode; a composite electron conductor layer electrically coupled to the first electrode, the composite electron conductor layer including a plurality of nanoparticles obtainable by methods described herein; an active layer coupled to the composite electron conductor layer; and a second electrode electrically coupled to the active layer.

Given nanoparticles, particularly nanocrystals obtainable by methods described herein, it is possible to fabricate a solar cell by forming a first electrode; depositing an active layer over the first electrode, the active layer comprising a plurality of nanocrystals obtainable by methods described herein; and depositing a second electrode over the active layer.

The inventors have disclosed components to be used to prepare substances of the invention as well as the substances themselves to be used within the methods described herein. It is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and a number of modifications that can be made to a number of molecules including the compounds are discussed, specifically contemplated is each and every combination and permutation of the compound and the modifications that are possible unless specifically indicated to the contrary. Thus, if a class of molecules, or substituents L, M and N are disclosed as well as a class of molecules or substituents R, S and T and an example of a combination molecule, M-S is disclosed, then even if each is not individually recited each is individually and collectively contemplated meaning combinations, L-R, L-S, L-T, M-R, M-T, N-R, N-S and N-T are considered disclosed.

The inventors have discovered that starting formulations that are Cu rich in the starting material, or Zn poor in the starting material, or both, work well in terms of the final product exhibiting photovoltaic behavior. The best photovoltaic results were observed for crystals of $Cu_2ZnSnS_4$ with Zn/Sn<1, thus crystals of $Cu_2ZnSnS_4$ richer in Cu gave the best results.

The method disclosed herein will now be illustrated using the following exemplary, non-limiting examples.

Synthesis of Nanocrystals—$CuInS_2$ Nanocrystals

EXAMPLE 1

Figure 2:
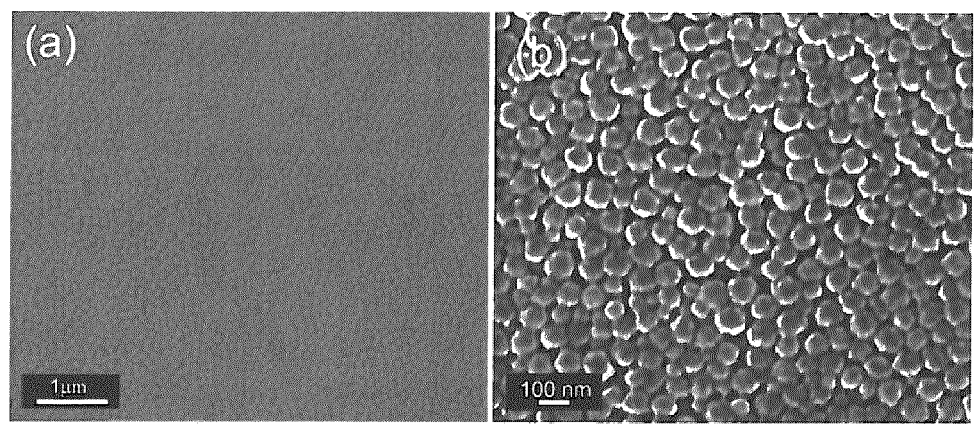
FIG. 2 shows SEM (scanning electron microscope) image of $CuInS_2$ nanocrystals prepared according to the method of Example 1.

In one glass bottle (labeled as bottle A), cupric(II) acetylacetonate, indium(III) chloride and 2-mercapto-5-n-propylpyrimidine were dissolved in 10 ml benzyl alcohol at temperature of 140° C. The concentration of cupric(II) acetylacetonate, indium(III) chloride and 2-mercapto-5-n-propylpyrimidine was 5, 5, 10 millimole per liter, respectively. And in another glass bottle (labeled as bottle B), thiourea was dissolved in 10 ml benzyl alcohol at room temperature and concentration is 10 millimole per liter. The solution of bottle A was heated to 180° C. and solution of bottle B was added into bottle A under stirring. Then the reaction mixture was stirred and hold at 180° C. for 20 min for the reaction to complete. After that, the bottle A was cooled down in air naturally. The mixture was centrifuged at 12000 rpm for 5 min and black precipitate was obtained. The black precipitate was then redispersed in the acetone to form a stable dispersion. FIGS. 1 and 2 depict TEM and SEM images, respectively, of $CuInS_2$ nanocrystals prepared.

EXAMPLE 2

Figure 3:
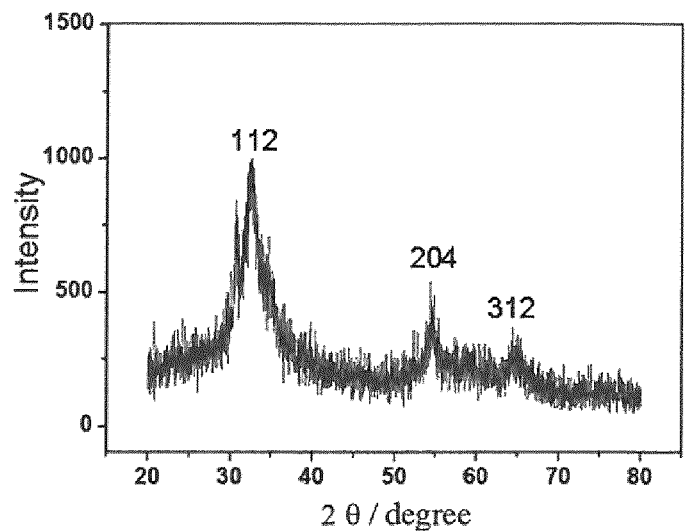
FIG. 3 shows XRD (X-ray diffraction; Co target) pattern of $CuInS_2$ nanocrystals prepared according to the method of Example 2 (JCPDS No. 085-1575)

In one glass bottle (labeled as bottle A), cupric(II) acetylacetonate, indium(III) chloride and 2-mercapto-5-n-propylpyrimidine were dissolved in 10 ml benzyl alcohol at temperature of 140° C. The concentration of cupric(II) acetylacetonate, indium(III) chloride and 2-mercapto-5-n-propylpyrimidine was 50, 50, 50 millimole per liter, respectively. And in another glass bottle (labeled as bottle B), thiourea was dissolved in 10 ml benzyl alcohol at room temperature and concentration is 100 millimole per liter. The solution of bottle A was heated to 180° C. and solution of bottle B was added into bottle A under stirring. Then the reaction mixture was stirred and hold at 180° C. for 20 min for the reaction to complete. After that, the bottle A was cooled down in air naturally. The mixture was centrifuged at 12000 rpm for 5 min and black precipitate was obtained. The black precipitate was then redispersed in the acetone to form a stable dispersion. FIG. 3 depicts the XRD image of $CuInS_2$ nanocrystals prepared.

EXAMPLE 3

In one glass bottle (labeled as bottle A), cupric(II) acetylacetonate, indium(III) chloride and 2-mercapto-5-n-propylpyrimidine were dissolved in 10 ml benzyl alcohol at temperature of 140° C. The concentration of cupric(II) acetylacetonate, indium(III) chloride and 2-mercapto-5-n-propylpyrimidine was 20, 20, 20 millimole per liter, respectively. And in another glass bottle (labeled as bottle B), thiourea was dissolved in 10 ml benzyl alcohol at room temperature and concentration is 40 millimole per liter. The solution of bottle A was heated to 180° C. and solution of bottle B was added into bottle A under stirring. Then the reaction mixture was stirred and hold at 180° C. for 20 min for the reaction to complete. After that, the bottle A was cooled down in air naturally. The mixture was centrifuged at 12000 rpm for 5 min and black precipitate was obtained. The black precipitate was then redispersed in the acetone to form a stable dispersion.

Nanocrystals obtained by the foregoing method had an average size of about 100 nm.

Synthesis of Nanocrystals—$Cu ZnSnS_4$ nanocrystals

EXAMPLE 4

Figure 4:
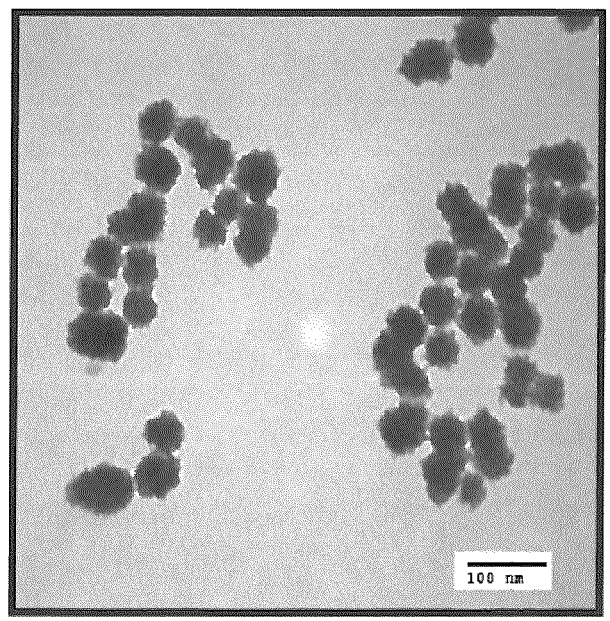
FIG. 4 shows TEM (transmission electron microscope) image of $Cu_2ZnSnS_4$ nanocrystals prepared according to the method of Example 4: (a) (b)
Figure 5:
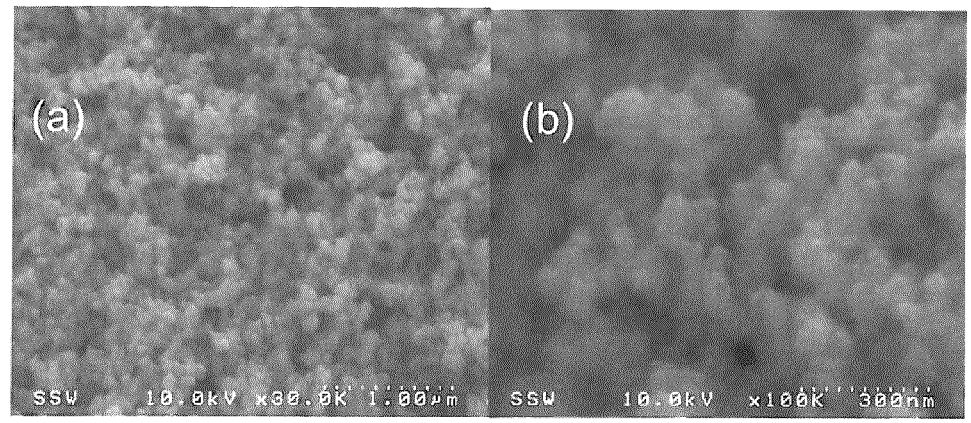
FIG. 5 shows SEM (scanning electron microscope) image of $Cu_2ZnSnS_4$ nanocrystals prepared according to the method of Example 4.

In one glass bottle (labeled as bottle A), cupric(II) acetylacetonate, zinc(II) chloride, tin(II) chloride and 2-mercapto-5-n-propylpyrimidine were dissolved in 3 mL benzyl alcohol at temperature of 160° C. The concentration of cupric(II) acetylacetonate, zinc(II) chloride, tin(II) chloride and 2-mercapto-5-n-propylpyrimidine was 10, 5, 5, 10 millimole per liter, respectively. And in another glass bottle (labeled as bottle B), thiourea was dissolved in 1.2 mL benzyl alcohol at room temperature and concentration is 20 millimole per liter. The solution of bottle A was heated to 180° C. and solution of bottle B was added into bottle A under stirring. Then the reaction mixture was stirred and hold at 180° C. for 10 min for the reaction to complete. After that, the bottle A was cooled down in air naturally. The mixture was centrifuged at 12000 rpm for 6 min and black precipitate was obtained. The black precipitate was then re-dispersed in the acetone to form a stable dispersion. FIGS. 4 and 5 depict TEM and SEM images, respectively, of $Cu_2ZnSnS_4$ nanocrystals prepared.

EXAMPLE 5

Figure 6:
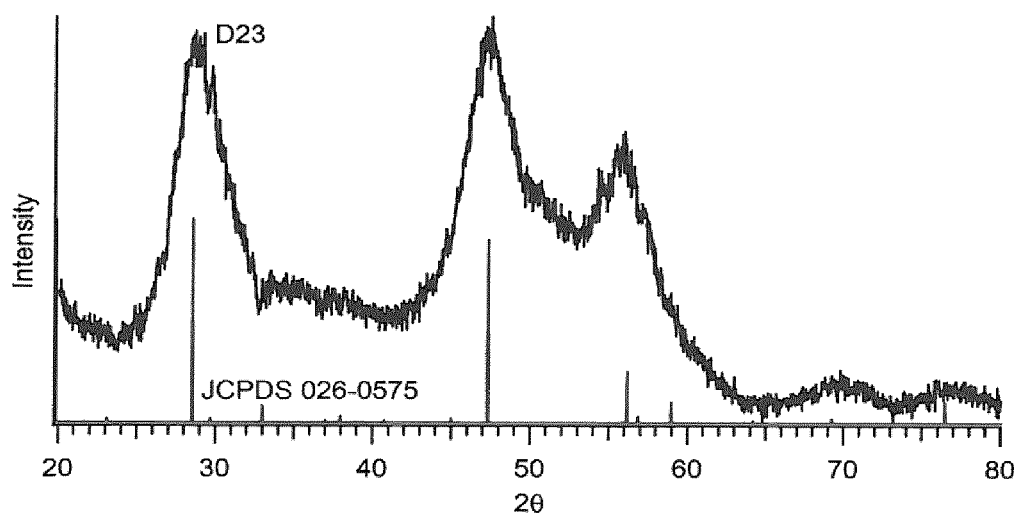
FIG. 6 shows XRD (X-ray diffraction; Cu target) pattern of $Cu_2ZnSnS_4$ nanocrystals prepared according to the method of Example 5 (JCPDS No. 085-1575).

In one glass bottle (labeled as bottle A), cupric(II) acetylacetonate, zinc(II) chloride, tin(II) chloride and 2-mercapto-5-n-propylpyrimidine were dissolved in 3 mL benzyl alcohol at temperature of 160° C. The concentration of cupric(II) acetylacetonate, zinc(II) chloride, tin(II) chloride and 2-mercapto-5-n-propylpyrimidine was 20, 20, 10, 60 millimole per liter, respectively. And in another glass bottle (labeled as bottle B), thiourea was dissolved in 1.2 mL benzyl alcohol at room temperature and concentration is 200 millimole per liter. The solution of bottle A was heated to 180° C. and solution of bottle B was added into bottle A under stirring. Then the reaction mixture was stirred and hold at 180° C. for 10 min for the reaction to complete. After that, the bottle A was cooled down in air naturally. The mixture was centrifuged at 12000 rpm for 6 min and black precipitate was obtained. The black precipitate was then re-dispersed in the acetone to form a stable dispersion. FIG. 6 depicts the XRD image of $Cu_2ZnSnS_4$ nanocrystals prepared.

EXAMPLE 6

In one glass bottle (labeled as bottle A), cupric(II) chloride, zinc(II) chloride, tin(II) chloride and 2-mercapto-5-n-propylpyrimidine were dissolved in 3 mL benzyl alcohol at temperature of 160° C. The concentration of cupric(II) acetylacetonate, zinc(II) chloride, tin(II) chloride and 2-mercapto-5-n-propylpyrimidine was 40, 20, 20, 40 millimole per liter, respectively. And in another glass bottle (labeled as bottle B), thiourea was dissolved in 1.2 ml benzyl alcohol at room temperature and concentration is 80 millimole per liter. The solution of bottle A was heated to 180° C. and solution of bottle B was added into bottle A under stirring. Then the reaction mixture was stirred and hold at 180° C. for 10 min for the reaction to complete. After that, the bottle A was cooled down in air naturally. The mixture was centrifuged at 12000 rpm for 6 min and black precipitate was obtained. The black precipitate was then re-dispersed in the acetone to form a stable dispersion.

Nanocrystals obtained by the foregoing method had an average size of about 50 nm. Moreover the increased collective photoactivity is thought to be a result of this self-assembled or stacking property Nanocrystals were obtained using the foregoing examples, nanocrystals that do not require subsequent annihilation or a protective sulfur atmosphere, and the relatively complicated apparatus needed to achieve such conditions.

Nanoparticles containing sulfur, copper and zinc are prepared by adding the contents of a vessel containing a copper compound ($Cu^{1+}$ and/or $Cu^{2+}$), zinc compound, and sulfur donor to a reaction vessel containing benzyl alcohol. The contents are heated and stirred at 160° C. for two minutes or until fully dissolved. 0.200 M thiourea in benzyl alcohol and a capping ligand, ArSH, are added and contents heated at 180° C. with stirring for 10 minutes. The contents are allowed to cool to room temperature. The resulting mixture is centrifuged and supernatant removed from the nanoparticles. The nanoparticles are dispersed in acetone and sonicated and centrifuged again, discarding the supernatant. This is done a twice or until the supernatant is colorless. The separated nanoparticles are allowed to dry and are weighed before dispersing in acetone at a concentration of about 20 g/L and sonication. The solution can be dropcast at a concentration of e.g., 18 µL/10 mm² in 6 µL intervals.

Nanoparticles containing sulfur, copper, zinc and tin can be prepared according to the foregoing procedure by including a tin compound in the initial mixture.

Similarly, nanoparticles containing sulfur, copper, zinc and tin and selenium may be prepared by including a selenium compound in the initial mixture of either of the foregoing examples.

Nanoparticles containing sulfur, copper and indium are prepared by adding the contents of a vessel containing a copper compound ($Cu^{1+}$ and/or $Cu^{2+}$), indium compound, and sulfur donor to a reaction vessel containing benzyl alcohol. The contents are heated and stirred at 160° C. for two minutes or until fully dissolved. 0.200 M thiourea in benzyl alcohol and a capping ligand, ArSH, are added and contents heated at 180° C. with stirring for 10 minutes. The contents are allowed to cool to room temperature. The resulting mixture is centrifuged and supernatant removed from the nanoparticles. The nanoparticles are dispersed in acetone and sonicated and centrifuged again, discarding the supernatant. This is done a twice or until the supernatant is colorless. The separated nanoparticles are allowed to dry and are weighed before dispersing in acetone at a concentration of about 20 g/L and sonication. The solution can be dropcast at a concentration of e.g., 18 µL/10 mm² in 6 µL intervals.

Nanoparticles containing sulfur, copper, indium and selenium by including a selenium compound in the initial mixture of the foregoing example.

Nanoparticles containing copper, tin and sulfur ($Cu_2SnS_3$) can be prepared by adding the contents of a vessel containing a copper compound and a tin compound to a reaction vessel containing benzyl alcohol. The contents are heated and stirred at 160° C. for two minutes or until fully dissolved. 0.200 M thiourea in benzyl alcohol and a capping ligand, ArSH, are added to the reaction vessel and it is heated at 180° C. with stirring for 10 minutes. The contents are allowed to cool to room temperature. The nanoparticles are extracted via centrifugation and the supernatant is discarded. The nanoparticles are dispersed in acetone and sonicated before being centrifuged again, discarding the supernatant. This is done a total of two times or until the supernatant is colourless. The separated nanoparticles are allowed to dry and are weighed before dispersing in acetone at a concentration of 20 g/L and sonicating. The solution is then ready to be dropcasted at a concentration of e.g., 18 µL/10 mm² in 6 µL intervals. Copper and tin metal salts result in $Cu_2SnS_3$ nanoparticles.

Depending upon application requirements, nanocrystals from about 10 nm up to about 100 nm are useful in photovoltaic cells. The results described herein thus establish that it is possible using the inventors' method to obtain e.g., $CuInS_2$ or $Cu_2ZnSnS_4$ nanocrystals suitable for use in photovoltaic cells. A further advantage is that by varying the capping agent the size of the nanocrystals obtained using the method can be varied.

As used herein, the terms "comprises", "comprising", "including" and "includes" are to be construed as being inclusive and open ended, and not exclusive. Specifically, when used in this specification including claims, the terms "comprises", "comprising", "including" and "includes" and variations thereof mean the specified features, steps or components are included. These terms are not to be interpreted to exclude the presence of other features, steps or components.

The disclosures of all documents referred to herein are incorporated herein by such reference as though the entirety of each document is reproduced herein in full.

The invention claimed is:

1. A method of forming inorganic nanoparticles comprising copper, sulfur and optionally selenium, and a first other metal or first and second other metals, the method comprising forming the nanoparticles by reacting one or the other or both of $Cu^{1+}$ and $Cu^{2+}$, a compound of the first other metal or a compound of the first and second other metals, and a thiourea, in the presence of a capping agent of the formula ArSH and a reducing solvent system and optionally a selenium source, to form a mixture containing nanoparticles.

2. The method of claim 1, wherein the nanoparticle is selected from the group consisting of $Cu_2ZnSnS_4$, $Cu_2SnS_3$, $Cu_2SnS_3$, $Cu_2ZnSn(S_{(1-x)}Se_x)_4$ and $CuIn(S_{(1-x)}Se_x)_2$ wherein $0 \le x \le 1$.

3. The method of claim 1, wherein ArSH is an optionally 5-substituted 2-mercaptopyrimidine.

4. The method of claim 3, wherein ArSH is 2-mercapto-5-n-propylpyrimidine.

5. The method of claim 3, wherein the thiourea is a thiocarbazide or a thiosemicarbazide or a mixture thereof.

6. The method of claim 5, wherein the thiourea is a compound having formula (I):

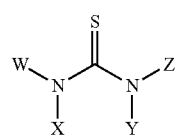

W, X, Y and Z are, independently of each other, H, R, —NRR wherein, if one or the other of W and X is —NRR, then the other of W and X is not —NRR, if one or the other of Y and Z is —NRR, then the other of Y and Z is not —NRR, and each R is, independently, H, alkyl, alkenyl, alkynyl, aryl, or —C(O)R, and wherein each R is optionally substituted and wherein —NRR can be iminyl in which the carbon atom of the imine unsaturation can be substituted or unsubstituted.

7. The method of claim 5, wherein the $Cu^{1+}$ compound is selected from the group consisting of CuCl, CuBr, a hydrate of CuCl, CuF, a hydrate of CuF, $CuNbO_3$, $CuNO_3 \cdot 2.5H_2O$, $Cu_2O$, $CuNO_3$ or a hydrate thereof, $CuClO_4$ or a hydrate thereof, $Cu_2SO_4$, copper (I) thiophenolate, copper(I) trifluoromethanesulfonate toluene, tetrakis(acetonitrile)copper(I) hexafluorophosphate, and a combination of any of the foregoing, and the $Cu^{2+}$ compound is selected from the group consisting of $Cu(Acac)_2$, $CuBr_2$, $CuCO_3 \cdot Cu(OH)_2$, $CuCl_2$, $CuCl_2 \cdot 2H_2O$, $CuF_2$, a hydrate of $CuF_2$, $Cu(NbO_3)_2$, $CuMoO_4$, $Cu(NO_3)_2 \cdot 2.5H_2O$, CuO, $Cu(NO_3)_2 \cdot 3H_2O$, $Cu(ClO_4)_2 \cdot 6H_2O$, $Cu_2P_2O_7$ or a hydrate thereof, $CuSO_4$, copper(II) 2-ethylhexanoate, copper(II) 2-pyrazinecarboxylate, copper(II) acetate hydrate, copper(II)trifluoroacetylacetonate, bis(ethylenediamine)copper(II) hydroxide, and a combination of any of the foregoing.

8. The method of claim 7, wherein the compound of the first metal is one or more of $SnCl_2$, $SnBr_2$, $SnF_2$, $SnI_2$, $Sn(NO_3)_2$, $Sn(ClO_4)_2$, $SnSO_4$, tin(II) acetate, tin(II) acetate hydrate, tin(II) acetylacetonate, tin(II) tris(trifluoromethanesulfonimide), $SnCl_4$, $SnBr_4$, $SnF_4$, $SnI_4$, $Sn(NO_3)_4$, $Sn(ClO_4)_4$, $Sn(SO_4)_2$, tin(IV)acetate, tin(IV) acetate hydrate, tin(IV) acetylacetonate, and tin(IV) tris(trifluoromethanesulfonimide).

9. The method of claim 7, wherein the compound of the second metal is one or more of $ZnCl_2$, $ZnBr_2$, $ZnF_2$, $ZnI_2$, $Zn(NO_3)_2$, $Zn(ClO_4)_2$, $ZnSO_4$, zinc(II)acetate, zinc(II) acetate hydrate, zinc(II) acetylacetonate, and zinc(II) tris(trifluoromethanesulfonimide).

10. The method of claim 7, wherein the nanoparticle includes selenium and the selenium source is one or more of $H_2SeO_3$, $H_2SeO_4$, $Na_2SeO_3$, $Na_2Se$, $H_2Se$, $Na_2SeO_4$, $Na_2SSeO_3$, and $H_2SSeO_3$.

11. The method of claim 7, wherein the compound of the first metal is one or more of $InCl_3$, $InBr_3$, $InF_3$, $InI_3$, $In(NO_3)_3$, $In(ClO_4)_3$, $In_2(SO_4)_3$, indium(III)acetate, indium (III) acetate hydrate, indium(III) acetylacetonate, indium(III) and tris(trifluoromethanesulfonimide).

12. The method of claim 7, wherein the nanoparticle is $Cu_2ZnSnS_4$, and the method includes a step of adding the thiourea to a mixture of the one or the other or both of a $Cu^{1+}$ and $Cu^{2+}$ compound, a $Zn^{2+}$ compound, a $Sn^{2+}$ or $Sn^{4+}$ compound, and the capping agent in the reducing solvent system.

13. The method of claim 12, wherein the thiourea is contained in the solvent system prior to addition to the mixture.

14. The method of claim 1, wherein the reacting step includes heating the reducing solvent system.

15. The method of claim 14, wherein the solvent system boils at a first temperature, and the reaction temperature of the reacting step is below the first temperature, the difference between the first temperature and the reaction temperature being at least 5° C.

16. The method of claim 15, wherein the reacting step is carried out at ambient pressure or greater.

17. The method of claim 16, wherein the first temperature is at least 160° C.

18. The method of claim 17, wherein the reaction temperature is at least 120° C.

19. The method of claim 18, wherein the reacting step is carried out at ambient pressure, said first temperature is at least 200° C., and the reaction temperature is at least 160° C.

20. The method of claim 19, wherein the solvent system comprises benzyl alcohol, and the reaction temperature is in the range of 160° C. to 200° C.

21. The method of claim 20, wherein the reacting step is carried out between 170° C. and 190° C.

22. The method of claim 21, further comprising the step of, subsequent to the reacting step, cooling the mixture of the nanoparticles and solvent system.

23. The method of claim 22, wherein the reducing solvent system comprises a hydroxylic solvent.

24. The method of claim 23, wherein the solvent system comprises benzyl alcohol, 1,2-propyleneglycol, 1,3-propylene glycol, glucose, glycerol, ethylene glycol, propylene carbonate, or a mixture of any of the foregoing.

25. The method of claim 24, wherein the nanoparticles are isolated as a monodispersion.

26. A ligand-capped nanoparticle selected from the group consisting of $Cu_2ZnSnS_4$, $Cu_2SnS_3$, $CuInS_2$, $Cu_2ZnSn(S_{(1-x)}Se_x)_4$ and $CuIn(S_{(1-x)}Se_x)_4$ wherein $0 \leq x \leq 1$, wherein a capping agent ArSH is bound to the surface of the particle.

* * * * *